(12) United States Patent
Lee et al.

(10) Patent No.: US 11,676,856 B2
(45) Date of Patent: *Jun. 13, 2023

(54) SEMICONDUCTOR DEVICE INCLUDING POLYSILICON STRUCTURES AND METHOD OF MAKING

(71) Applicant: TAIWAN SEMICONDUCTOR MANUFACTURING COMPANY, LTD., Hsinchu (TW)

(72) Inventors: J. J. Lee, Hsinchu (TW); Chun-Tse Tsai, Hsinchu (TW); M. C. Hang, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 14 days.

This patent is subject to a terminal disclaimer.

(21) Appl. No.: 17/380,340

(22) Filed: Jul. 20, 2021

(65) Prior Publication Data

US 2021/0351070 A1 Nov. 11, 2021

Related U.S. Application Data

(60) Continuation of application No. 16/773,640, filed on Jan. 27, 2020, now Pat. No. 11,094,584, which is a division of application No. 15/685,220, filed on Aug. 24, 2017, now Pat. No. 10,553,476.

(60) Provisional application No. 62/511,473, filed on May 26, 2017.

(51) Int. Cl.
*H01L 21/768* (2006.01)
*H01L 21/28* (2006.01)
*H01L 21/225* (2006.01)
*H01L 21/02* (2006.01)
*H01L 29/49* (2006.01)
*H01L 49/02* (2006.01)

(52) U.S. Cl.
CPC .. *H01L 21/76829* (2013.01); *H01L 21/02216* (2013.01); *H01L 21/2257* (2013.01); *H01L 21/28035* (2013.01); *H01L 21/28044* (2013.01); *H01L 28/84* (2013.01); *H01L 29/4925* (2013.01)

(58) Field of Classification Search
CPC ......... H01L 21/76829; H01L 21/02216; H01L 21/2257; H01L 21/28035; H01L 21/28044; H01L 28/84; H01L 29/4925
See application file for complete search history.

(56) References Cited

U.S. PATENT DOCUMENTS

| 5,614,428 A | 3/1997 | Kapoor |
| 5,712,196 A | 1/1998 | Ibok |
| 5,837,598 A | 11/1998 | Aronowitz et al. |

(Continued)

*Primary Examiner* — Shahed Ahmed
*Assistant Examiner* — Vicki B. Booker
(74) *Attorney, Agent, or Firm* — Hauptman Ham, LLP

(57) ABSTRACT

A semiconductor device includes a substrate. The semiconductor device further includes a first polysilicon structure over the substrate, wherein the first polysilicon structure has a first grain size. The semiconductor device further includes a first barrier layer over the first polysilicon structure, wherein the first barrier layer has a non-uniform thickness. The semiconductor device further includes a second polysilicon structure over the first barrier layer, wherein the second polysilicon structure has a second grain size smaller than the first grain size.

20 Claims, 7 Drawing Sheets

(56) References Cited

U.S. PATENT DOCUMENTS

| | | | |
|---|---|---|---|
| 6,147,388 A * | 11/2000 | Ma | H01L 29/4925 |
| | | | 438/585 |
| 6,150,251 A * | 11/2000 | Yew | H01L 21/28035 |
| | | | 257/E29.155 |
| 6,174,807 B1 | 1/2001 | Kizilyalli | |
| 8,835,291 B2 | 9/2014 | Huang | |
| 2002/0004294 A1 | 1/2002 | Gardner | |
| 2002/0149064 A1 | 10/2002 | Ballantine | |
| 2003/0045081 A1 | 3/2003 | Lin | |
| 2003/0047734 A1 | 3/2003 | Fu | |
| 2003/0216013 A1 * | 11/2003 | Geiss | H01L 21/0262 |
| | | | 257/E21.336 |
| 2005/0130364 A1 | 6/2005 | Beintner et al. | |
| 2010/0173466 A1 | 7/2010 | Tey | |
| 2012/0001267 A1 * | 1/2012 | Lee | H01L 21/823842 |
| | | | 257/E27.06 |
| 2012/0193796 A1 | 8/2012 | Lin | |
| 2015/0021776 A1 * | 1/2015 | Lin | H01L 29/4916 |
| | | | 257/754 |

\* cited by examiner

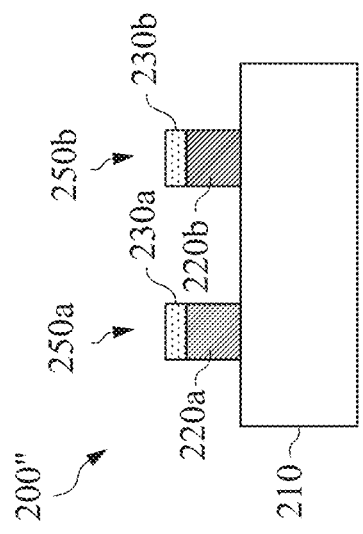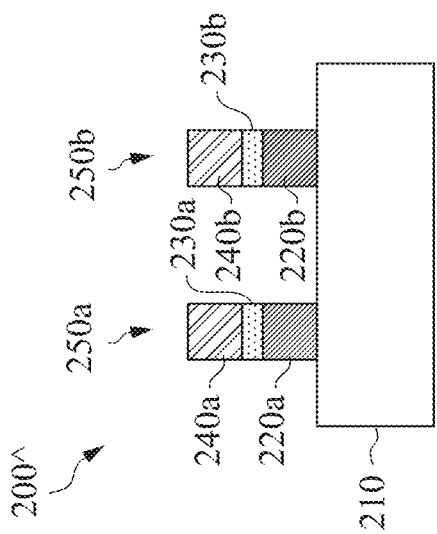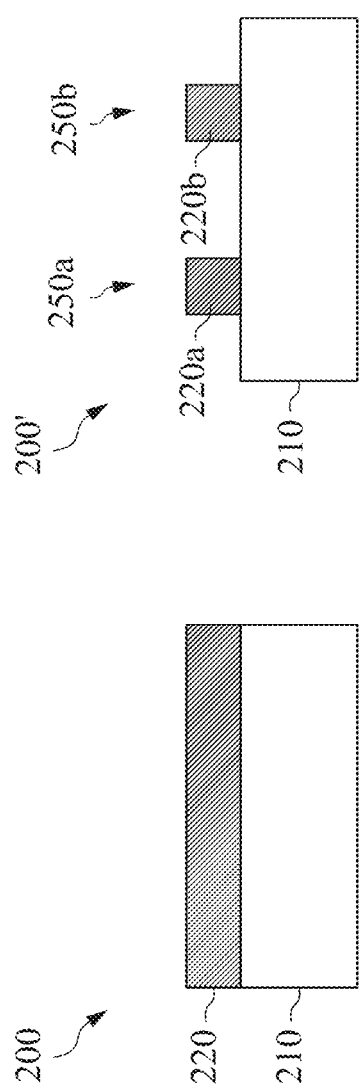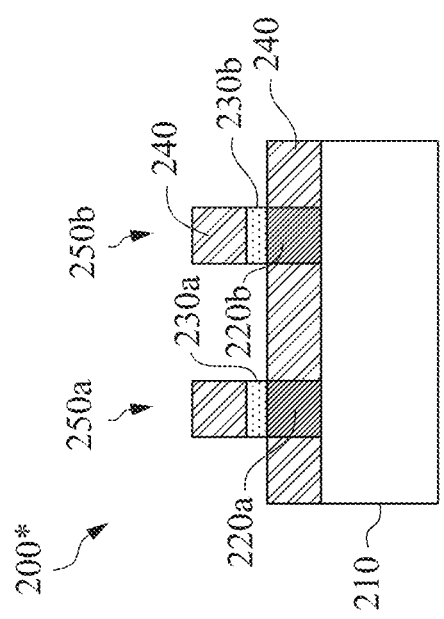

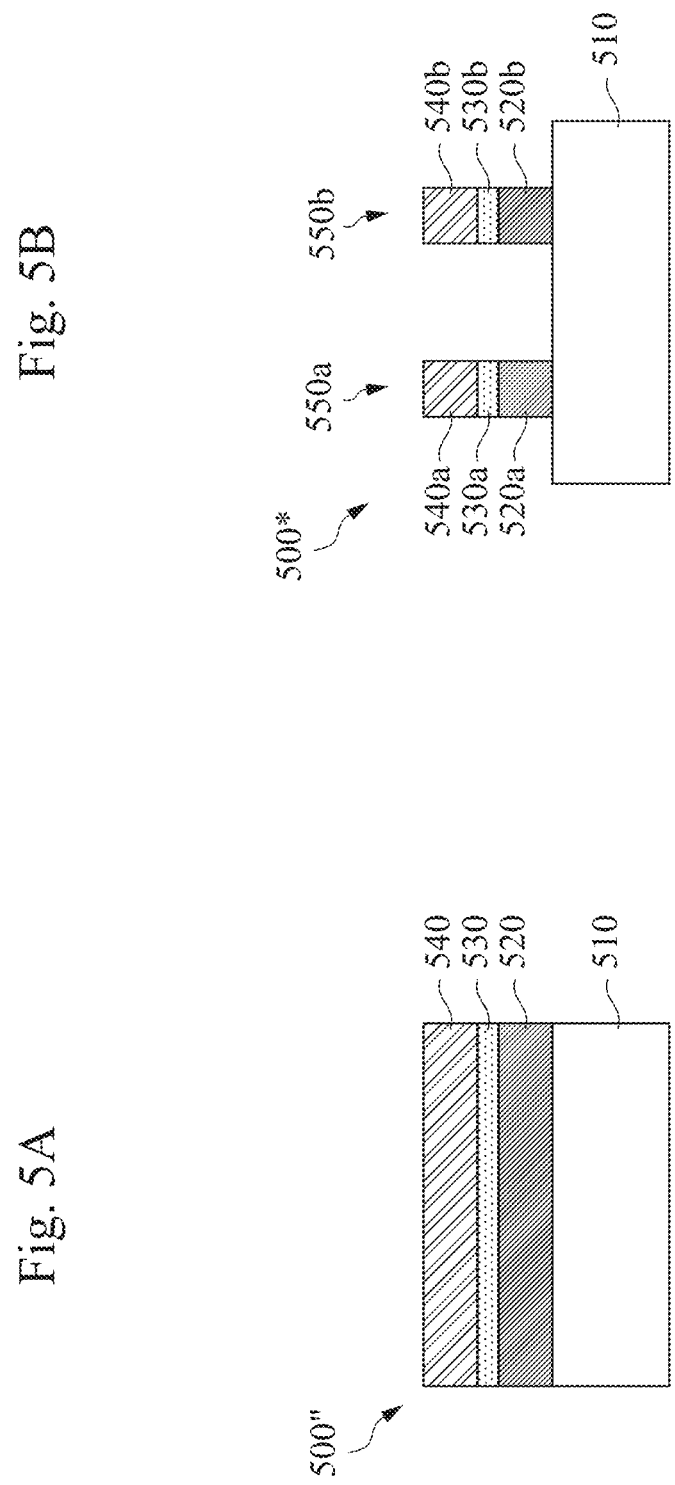
Fig. 5A  Fig. 5B  Fig. 5C  Fig. 5D

SEMICONDUCTOR DEVICE INCLUDING POLYSILICON STRUCTURES AND METHOD OF MAKING

RELATED APPLICATION

This application is continuation of U.S. application Ser. No. 16/773,640, filed Jan. 27, 2020, which is a divisional of U.S. application Ser. No. 15/685,220, filed Aug. 24, 2017, now U.S. Pat. No. 10,553,476, issued Feb. 4, 2020, which claims the benefit of U.S. Provisional Application No. 62/511,473, filed May 26, 2017, which are hereby incorporated by reference in their entireties.

BACKGROUND

Polysilicon structures, such as transistor gate structures and resistors, are used in a variety of devices. During manufacturing of a complete semiconductor device, the polysilicon structure is subjected to numerous thermal processes. The thermal processes increase a grain size within the polysilicon structures.

Doping of the polysilicon structures is used to control resistance for an electrical signal passing through the polysilicon structure. The dopants migrate along grain boundaries in the polysilicon structures. The amount of resistance in the polysilicon structures is a factor in power consumption of a semiconductor device including the polysilicon structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2E are cross-sectional views of a semiconductor device at various stages of manufacture according to some embodiments.

FIGS. 5A-5D are cross-sectional views of polysilicon structures at various stages of manufacture according to some embodiments.

DETAILED DESCRIPTION

Figure 1:
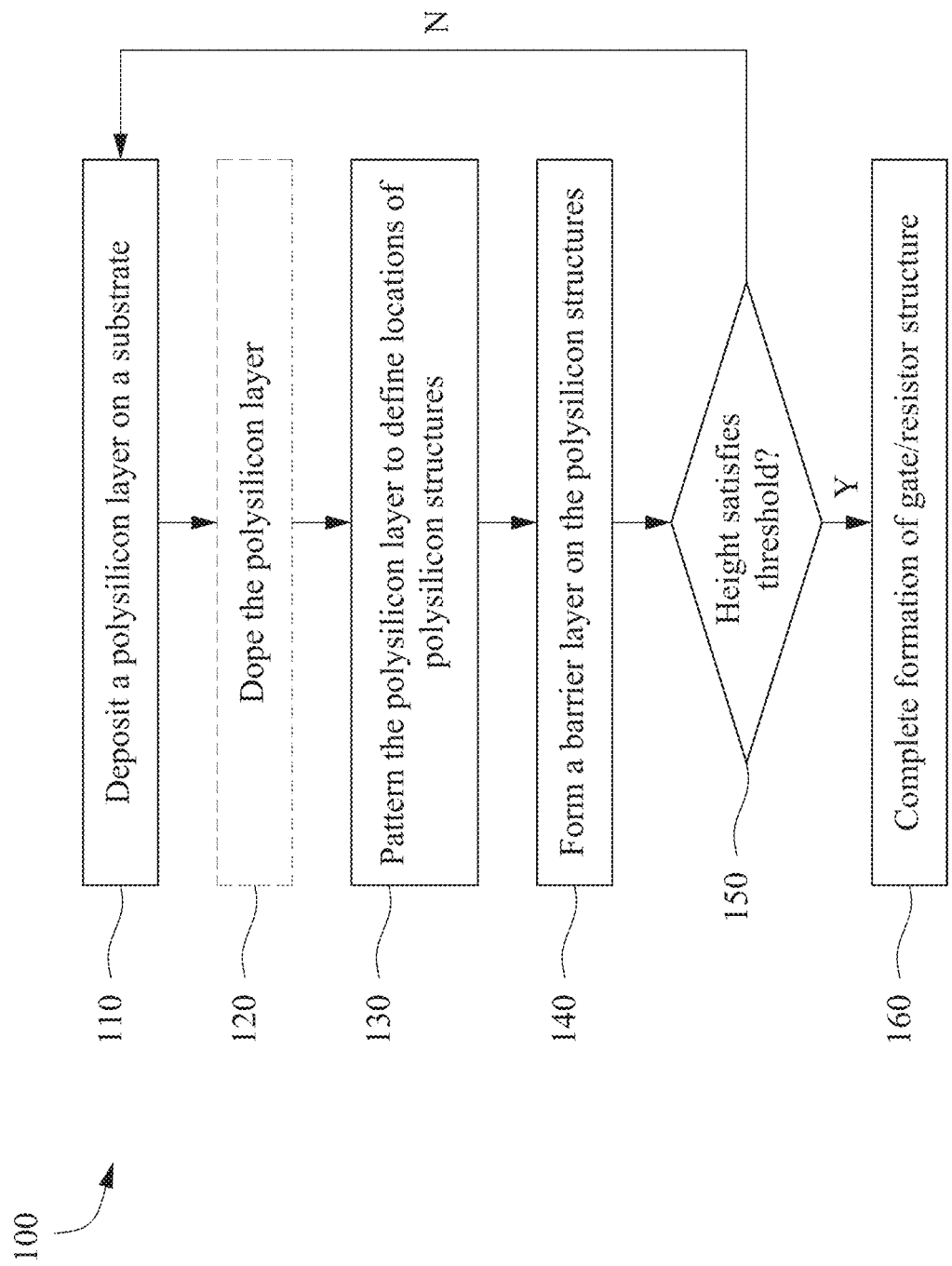
FIG. 1 is a flowchart of a method of forming a semiconductor device according to some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Polysilicon structures are used in a variety of semiconductor devices, such as memory devices, logic devices, and other suitable devices. Providing stable and predictable resistance within polysilicon structures helps to increase stability of an operating voltage of the semiconductor device and increase predictability of power consumption. As device sizes shrink, an importance of battery life for semiconductor devices, such as portable devices for the internet of things (IOT), increases. Accurate prediction of power consumption by the semiconductor device helps to reduce overdesign of batteries and facilitate a continued decrease in device sizes. Semiconductor devices like static random access memory (SRAM) are also effected by a stability of an operating voltage across different polysilicon structures. For example, an increased resistance in a polysilicon gate structure will, in some instances, decrease a speed of a signal through the SRAM to a point that an incorrect value is read out of the SRAM, i.e., a "0" is read instead of a "1" and vice versa.

Conductivity of the polysilicon structures is determined in part based on a dopant concentration in the polysilicon structures. As dopant concentration increases, conductivity also increases. Dopants in polysilicon structures migrate along grain boundaries of the polysilicon structures. In addition, the decrease in device size results in more densely located devices and an increase in a number of thermal processes performed during manufacturing the semiconductor device. These thermal processes cause grain sizes in the polysilicon structures to increase. The increased grain sizes reduce migration paths for dopants within the polysilicon structure, which in turn reduces a number of conductive paths through the polysilicon structure and increases resistance of the polysilicon structure. Further, the increase in grain sizes is not easily controlled within a continuous polysilicon material. The difficulty in controlling grain size growth within a continuous polysilicon material decreases a level of predictability of the resistance of different polysilicon structures within a same semiconductor device.

In order to control a size of grains within polysilicon structures, at least one barrier layer is used to reduce or prevent grain growth. Grain boundaries which contact the barrier layer cease expanding, which inhibits increases in grain size within the polysilicon structures. As a result, resistance of the polysilicon structures within a semiconductor device is lower and more uniform in comparison with polysilicon structures which do not include the at least one barrier layer. The increased uniformity of resistance of the polysilicon structures helps with the design of memory devices by reducing a risk of memory errors resulting from signal delays cause by unpredictable resistance values. The lower and more uniform resistance also reduces an amount of overdesign for batteries in portable devices to help facilitate reduction in overall device size.

FIG. 1 is a flowchart of a method 100 of making a semiconductor device according to some embodiments. Method 100 includes operation 110 in which a polysilicon layer is deposited on a substrate. The polysilicon layer is deposited to thickness ranging from 10 nanometers (nm) to 400 nm. The thickness of the polysilicon layer is determined based on a technology node of a semiconductor device in which the polysilicon structures are included. As a size of the technology node decreases, the thickness of the polysilicon layer decreases. In some embodiments, the semiconductor device is manufactured using a technology node such as N90, N55, N40 or another suitable technology node.

In some embodiments, the polysilicon layer is deposited over a dielectric layer, such as an interfacial layer, a gate dielectric layer, an isolation feature or another suitable dielectric layer. In some embodiments, the polysilicon layer is deposited using a chemical vapor deposition (CVD), such as a low-pressure CVD (LPCVD). In some embodiments, the polysilicon layer is deposited using a silane (SiH$_4$) precursor.

In some embodiments, the polysilicon layer is deposited at a temperature ranging from about 450° C. to about 620° C. A deposition temperature of the polysilicon layer impacts a grain size of the polysilicon layer deposited. The grain size of the polysilicon layer in turn impacts a number of possible conductive paths within the polysilicon structures. As the deposition temperature increases, a size of the grains in the polysilicon layer increases.

In optional operation 120, the polysilicon layer is doped. In some embodiments, operation 120 is performed simultaneously with operation 110, i.e., an in-situ doping during deposition of the polysilicon layer. In-situ doping includes incorporating a dopant material, such as arsenic, phosphorous, boron or another suitable dopant, into the flow of material, e.g., silane, used to deposit the polysilicon layer.

In some embodiments, operation 120 includes an ion implantation process. In some embodiments, the ion implantation occurs at an energy ranging from about 30 kilo electronvolts (KeV) to 75 KeV. As the energy of the implantation process increases a depth of the dopant implanted into the polysilicon layer increases. Thus, an energy of the implantation process is determined in part based on a thickness of the polysilicon layer. Further, a higher implantation energy damages a crystal structure of the polysilicon layer which increases a resistance of the polysilicon layer. A target resistance of the polysilicon structures is also a factor in selecting the implantation energy. In some embodiments, the dosage of the dopant implanted ranges from about 5E14 atoms/cm$^2$ to about 1E16 atoms/cm$^2$. As a dosage increases resistance in the polysilicon layer decreases.

In some embodiments, operation 120 includes depositing a layer of dopant material on the polysilicon layer and annealing the semiconductor device to drive the dopants into the polysilicon layer. In some embodiments, operation 120 is omitted and a doping process is performed after operation 150 of method 100.

In operation 130, the polysilicon layer is patterned to define locations of polysilicon structures. In some embodiments, the patterning process includes depositing a photoresist over the polysilicon layer. A lithography process is then used to pattern the photoresist. The pattern is then developed to remove portions of the photoresist corresponding to portions of the polysilicon layer to be removed. The polysilicon layer is then etched using the patterned photoresist as a mask. In some embodiments, the etching process includes a wet etching process. In some embodiments, the wet etchant includes nitric acid, hydrochloric acid or another suitable etchant. In some embodiments, the etching process includes a dry etching process. In some embodiments, the dry etchant includes chlorine-containing gas, fluorine-containing gas or another suitable etchant. In some embodiments, the photoresist is removed during the etching process. In some embodiments, an ashing process is used to remove residual photoresist following the etching process.

In some embodiments, the polysilicon layer is patterned using a laser drilling process or another suitable material removal process. Following, the patterning process, one or more polysilicon structures are defined on the substrate. In some embodiments, at least one polysilicon structure is over an n-doped region of the substrate and another polysilicon structure is over a p-doped region of the substrate.

In operation 140, a barrier layer is formed over the polysilicon structures. A thickness of the barrier layer near a center of each polysilicon structure is less than a thickness of the barrier layer near an edge of the polysilicon structure. The increased thickness of the barrier layer near the edge of the polysilicon structure is a result of formation of the barrier layer at the sidewalls of the polysilicon structure as well as a top surface of the polysilicon structure. The formation of the barrier layer at the sidewalls of the polysilicon structure is result of the patterning of the polysilicon layer prior to formation of the barrier structures. The formation of the barrier structures acts on both the top surface of the patterned polysilicon structure as well as the sidewalls of the patterned silicon structure resulting in increased thickness of the barrier layer near the sidewalls of the patterned polysilicon layer. In some embodiments, a thickness of the barrier layer near a center of the polysilicon structure ranges from about 0.3 nm to about 1.5 nm. In some embodiments, a thickness of the barrier layer near an edge of the polysilicon structure ranges from about 2 nm to about 10 nm. As a thickness of the barrier layer increases, a resistance in the polysilicon structure increases. If a thickness of the barrier layer is too small, the barrier layer will not be able to inhibit increases in grain size in the polysilicon material. In some embodiments, a thickness of the barrier layer over the center region of the polysilicon structure is substantially uniform and the thickness increases in a gradient a distance D from the edge of the polysilicon structure. In some embodiments, the distance D ranges from about 2 nm to about 3 nm from the edge of the polysilicon structure. As the distance D increases the resistance of the polysilicon structure increases. The distance D is determined by a rate of formation of the barrier layer at the edge of the polysilicon structure.

The barrier layer has a dielectric constant ranging from about 2 to about 13. In some embodiments, the barrier layer includes silicon oxide, silicon nitride, silicon oxynitride, silicon carbide or another suitable barrier material. In some embodiments, the silicon oxynitride is represented by SiO$_a$N$_b$, where a ratio of a/b ranges from about 0.1 to about 10. In some embodiments, the silicon nitride is represented by Si$_x$N$_y$, where a ratio of x/y ranges from about 0.1 to about 10.

In some embodiments, the barrier layer is formed by physical vapor deposition (PVD), CVD, ALD or another suitable deposition process. In some embodiments, the barrier layer is formed by exposing the polysilicon structure to an ambient environment containing oxygen. In some embodiments, an oxygen-containing gas is blown across the polysilicon structures. A thickness of the barrier layer is determined by a duration of the formation process. For example, as a length of time that the polysilicon is exposed to the ambient environment containing oxygen increases, a thickness of the barrier increases. In some embodiments, a temperature of the barrier layer formation process ranges from about 25° C. to about 1100° C. A higher temperature increases a size of grains in the polysilicon structure. In some embodiments, In some embodiments, the barrier layer is doped. In some embodiments, a species of dopant in the barrier layer is a same species as that in the polysilicon structures. In some embodiments, a species of dopant in the barrier layer is different from a species of dopant in the polysilicon structures. In some embodiments, the barrier is doped by an in-situ process, an ion implantation process, an anneal process (which drives dopants from the polysilicon structures into the barrier layer) or another suitable process.

In operation 150, whether the Height of the polysilicon structures including the barrier layer satisfies a threshold value is determined. The height is measured form a top surface of the substrate in a direction perpendicular to the top surface of the substrate. The threshold value is determined based on a technology node of the semiconductor device. In some embodiments, the threshold value ranges from about 20 nm to 400 nm. As a size of the technology node decreases, the threshold value decreases. In some embodiments, the threshold value is larger than a desired final height of the polysilicon structure including the barrier layer to account for a subsequent material removal process, such as a planarization process.

If the height fails to satisfy the threshold value, then method 100 returns to operation 110 and an additional polysilicon layer is deposited. The sequence of operations 110-140 are repeated until the height satisfies the threshold value. In some embodiments, operation 140 is omitted in a final repetition of operations 110-140. In some embodiments where operation 140 is not omitted in the final repetition, a top-most barrier layer is removed using a material removal process, such as etching, planarization, or another suitable material removal process.

If the height satisfies the threshold value, then method 100 proceeds to operation 160 in which processes for completion of a gate structure or a resistor structure are completed. A gate structure is formed where the polysilicon structure is over a conductive region of the substrate. A resistor structure is formed where the polysilicon structure is over a non-conductive region of the substrate, such as an isolation feature. The subsequent processes include formation of spacers; formation of source/drain features; formation of lightly doped drain (LDD) features; formation of an inter-layer dielectric (ILD); formation of contact plugs; formation of interconnect structures; or other suitable processes.

In some embodiments, method 100 includes additional operations. For example, in some embodiments, method 100 includes an operation for removing a top most barrier layer over a top most polysilicon structure. In some embodiments, an order of operations is adjusted. For example, in some embodiments, operation 140 is performed prior to operation 130. In some embodiments, at least one operation of method 100 is omitted. For example, in some embodiments, operation 120 is omitted and a single doping process is performed during operation 160.

FIGS. 2A-2E are cross-sectional view of a semiconductor device at various stages of manufacturing according to some embodiments. Same reference numbers correspond to same elements in each of the Figures. FIG. 2A is a cross-sectional view of a semiconductor device 200 following deposition of polysilicon layer 220 according to some embodiments. Polysilicon layer 220 is on substrate 210. In some embodiments, a dielectric layer, such as an interfacial layer, a gate dielectric, an isolation structure or another suitable dielectric layer, is between at least a portion of polysilicon layer 220 and substrate 210. A thickness of polysilicon layer 220 ranges from about 10 nm to about 400 nm. In some embodiments, polysilicon layer 220 is doped.

FIG. 2B is a cross-sectional view of semiconductor device 200' following patterning of the polysilicon layer according to some embodiments. In comparison with semiconductor device 200, semiconductor device 200' includes polysilicon structures 220a and 220b. Polysilicon structure 220a is part of a gate structure 250a. Polysilicon structure 220b is part of a gate structure 250b. Polysilicon structures 220a and 220b are formed by removing portions of polysilicon layer 220, such as by using a lithography and etching process.

In some embodiments, a portion of substrate 210 below polysilicon structure 220a has a different dopant type from a portion of substrate 210 below polysilicon structure 220b. In some embodiments, an isolation feature, such as a shallow trench isolation (STI), is in substrate 210 below polysilicon structure 220a or polysilicon structure 220b. Semiconductor device 200' includes two polysilicon structures 220a and 220b. In some embodiments, semiconductor device 200' includes more than two polysilicon structures.

FIG. 2C is a cross-sectional view of semiconductor device 200" following formation of barrier layers 230a and 230b according to some embodiments. In comparison with semiconductor device 200', semiconductor device 200" includes barrier layer 230a over polysilicon structure 220a; and barrier layer 230b over polysilicon structure 220b. Barrier layers 230a and 230b independently have a dielectric constant ranging from about 2 to about 13. In some embodiments, barrier layers 230a and 230b include silicon oxide, silicon nitride, silicon oxynitride, silicon carbide or another suitable barrier material. In some embodiments, barrier layer 230a includes a same material as barrier layer 230b. In some embodiments, barrier layer 230a includes a different material from barrier layer 230b.

A thickness of each of barrier layers 230a and 230b near a center of a corresponding polysilicon structure 220a or 220b is less than a thickness of the barrier layer 230a or 230b near an edge of the corresponding polysilicon structure 220a or 220b. In some embodiments, a thickness of the barrier layers 230a and 230b near a center of the corresponding polysilicon structure 220a or 220b ranges from about 0.3 nm to about 1.5 nm. In some embodiments, a thickness of the barrier layers 230a and 230b near an edge of the corresponding polysilicon structure 220a and 220b ranges from about 2 nm to about 10 nm. As a thickness of the barrier layer increases, a resistance in the polysilicon structure increases. If a thickness of the barrier layer is too small, the barrier layer will not be able to inhibit increases in grain size in the polysilicon material. In some embodiments, a thickness of the barrier layers 230a and 230b over the center region of the corresponding polysilicon structure 220a or 220b is substantially uniform and the thickness increases in a gradient a distance D toward the edge of the corresponding polysilicon structure 220a or 220b. In some embodiments, the distance D ranges from about 2 nm to about 3 nm from the edge of the polysilicon structure 220a or 220b. As the distance D increases the resistance of the polysilicon structure 220a or 220b increases.

In some embodiments, a thickness profile of barrier layer 230a matches a thickness profile of barrier layer 230b. In some embodiments, the thickness profile of barrier layer 230a is different from the thickness profile of barrier layer 230b. For examples, in some embodiments, a center thickness of both barrier layers 230a and 230b is the same, but a thickness of barrier layer 230a near an edge of polysilicon structure 220a is different from a thickness of barrier layer 230b near an edge of polysilicon structure 220b.

FIG. 2D is a cross-sectional view of semiconductor device 200* after deposition of a second polysilicon layer 240 according to some embodiments. In comparison with semiconductor device 200", semiconductor device 200* includes polysilicon layer 240 over portions of substrate 210 exposed by polysilicon structures 220a and 220b. Polysilicon layer 240 is also over barrier layers 230a and 230b. A thickness of polysilicon layer 240 ranges from about 10 nm to about 400 nm. In some embodiments, polysilicon layer 240 has a same thickness as polysilicon layer 220. In some embodiments, polysilicon layer 240 has a different thickness from polysilicon layer 220. In some embodiments, polysilicon layer 240 is deposited using a same process as that used for polysilicon layer 220. In some embodiments, polysilicon layer 240 is deposited using a different process from that used for polysilicon layer 220. In some embodiments, polysilicon layer 240 is doped.

FIG. 2E is a cross-sectional view of semiconductor device 200^ following patterning of the polysilicon layer 240 according to some embodiments. In comparison with semiconductor device 200*, semiconductor device 200^ includes polysilicon structure 240a over barrier layer 230; and polysilicon structure 240b over barrier layer 230b. Polysilicon structure 240a is part of a gate structure 250a. Polysilicon structure 240b is part of a gate structure 250b. Polysilicon structures 240a and 240b are formed by removing portions of polysilicon layer 240, such as by using a lithography and etching process. In some embodiments, the removal process for forming polysilicon structures 240a and 240b is a same as the removal process to form polysilicon structures 220a and 220b. In some embodiments, the removal process for forming polysilicon structures 240a and 240b is different from the removal process to form polysilicon structures 220a and 220b.

Figure 3:
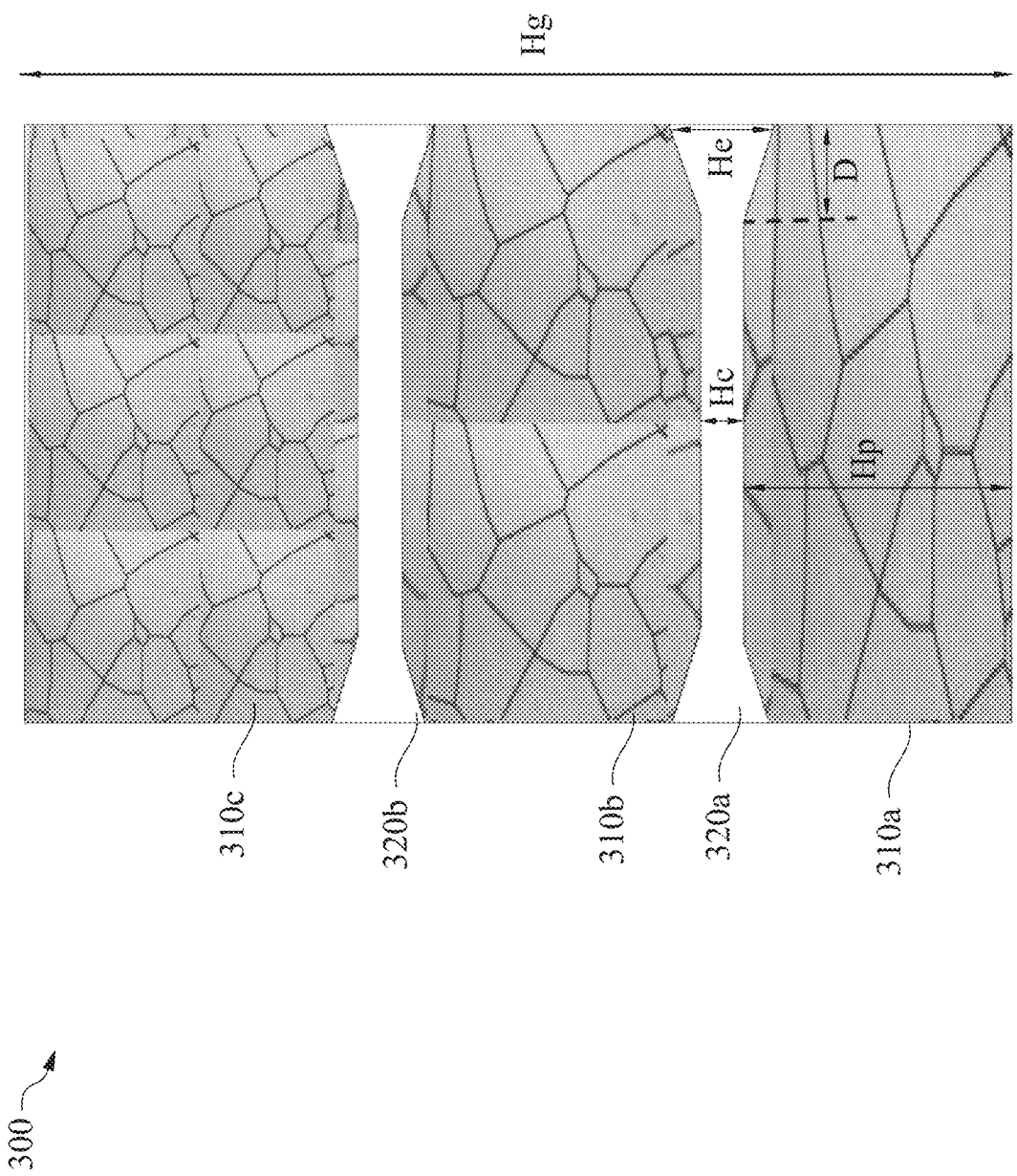
FIG. 3 is a cross-sectional view of a gate structure according to some embodiments.

FIG. 3 is a cross-sectional view of a gate structure 300 according to some embodiments. Gate structure 300 includes polysilicon structures 310a, 310b and 310c, collectively referred to as polysilicon structures 310. Gate structure 300 further includes barrier layers 320a and 320b, collectively referred to as barrier layers 320. While gate structure 300 includes two barrier layers, in some embodiments, a number of barrier layers in gate structure 300 ranges from 1 to about 10. Barrier layers 320 independently have a dielectric constant ranging from about 2 to about 13. Barrier layer 320a is between polysilicon structure 310a and polysilicon structure 310b. Barrier layer 320b is between polysilicon structure 310b and polysilicon structure 310c. A grain size in polysilicon structure 310a is greater than a grain size in polysilicon structure 310b. A grain size in polysilicon structure 310b is greater than a grain size in polysilicon structure 310c. The larger grain sizes are the result of the lower polysilicon structures 310 being subjected to a greater number of thermal processes.

A thickness Hc of the barrier layers 320 near a center of polysilicon structures 310 is less than a thickness He of the barrier layers 320 near an edge of the polysilicon structures 310. In some embodiments, thickness Hc of the barrier layers 320 near a center of the polysilicon structures 310 independently ranges from about 0.3 nm to about 1.5 nm. In some embodiments, thickness He of the barrier layers 320 near an edge of the polysilicon structures 310 independently ranges from about 2 nm to about 10 nm. In some embodiments, a thickness profile of barrier layer 320a is a same as a thickness profile of barrier layer 320b. In some embodiments, the thickness profile of barrier layer 320a is different from the thickness profile of barrier layer 320b. As a thickness of the barrier layers 320 increase, a resistance in the gate structure 300 increases. If a thickness of the barrier layers 320 is too small, the barrier layers will not be able to inhibit increases in grain size in the polysilicon structures 310. In some embodiments, a thickness of the barrier layers 320 over the center region of the polysilicon structures 310 is substantially uniform and the thickness increases in a gradient a distance D from the edge of the polysilicon structures 310. In some embodiments, the distance D independently ranges for each of the barrier layers 320 from about 2 nm to about 3 nm from the edge of the polysilicon structure. As the distance D increases the resistance of the gate structure 300 increases.

A thickness Hp of polysilicon structures 310 independently ranges from about 10 nm to about 400 nm. In some embodiments, at least one of polysilicon structures 310 is doped. The thickness Hp of polysilicon structures 310 is determined based on a technology node of the semiconductor device containing gate structure 300. A gate height Hg of gate structure 300 ranges from about 15 nm to about 410 nm. The gate height Hg of gate structure 300 is determined based on a technology node of the semiconductor device containing gate structure 300.

Figure 4:
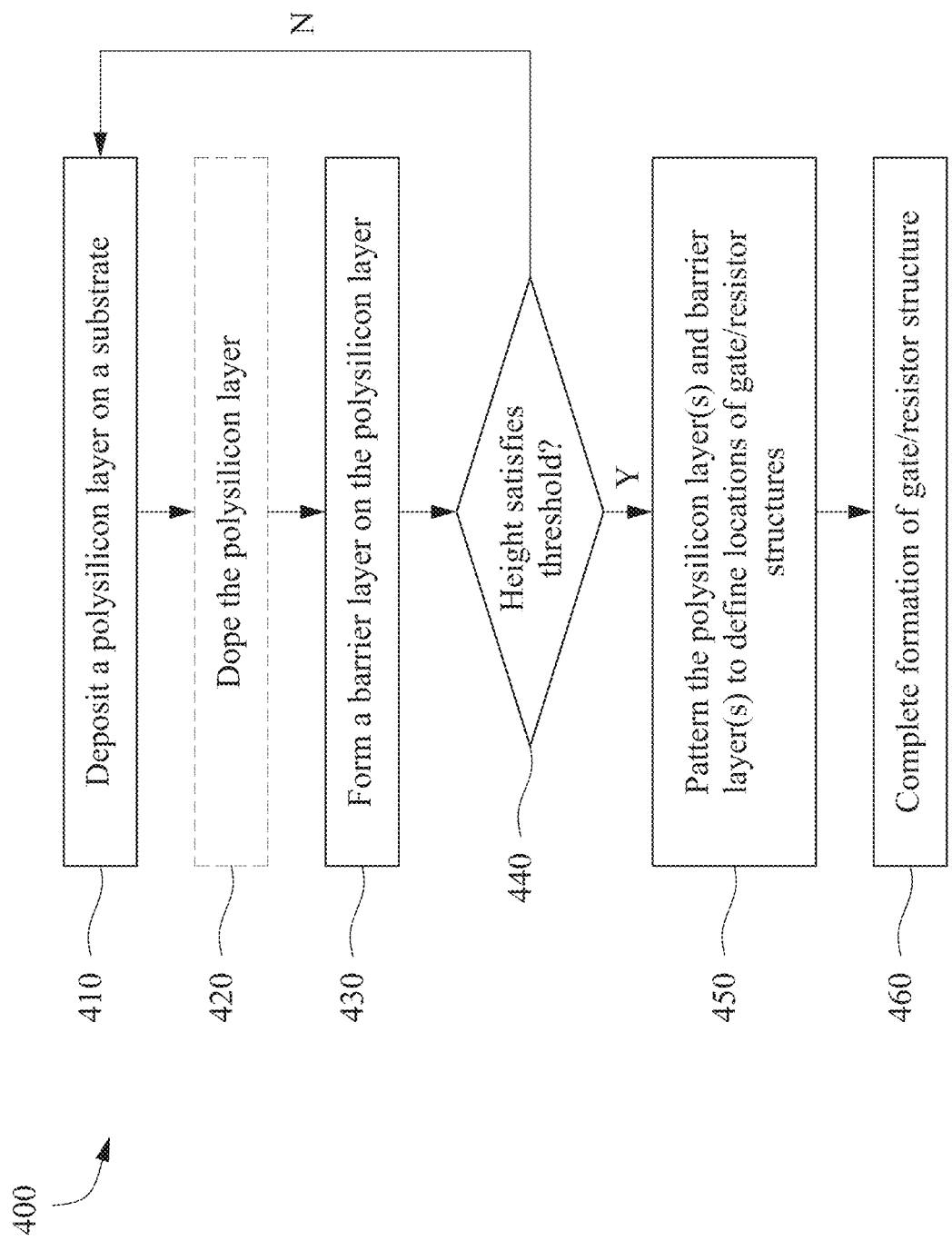
FIG. 4 is a flowchart of a method of forming polysilicon structures according to some embodiments.

FIG. 4 is a flowchart of a method 400 of making a semiconductor device according to some embodiments. In comparison with method 100, method 400 includes a patterning operation following the polysilicon layers and barrier layers satisfying the height threshold. The single patterning process helps to reduce complexity of method 400 in comparison with other approaches. Also, the barrier layers formed in method 400 have a substantially constant thickness because the formation process act on the top surface of the polysilicon layer with minimal actions on sidewalls of the polysilicon.

In operation 410, a polysilicon layer is deposited on the substrate. Operation 410 is similar to operation 110; and the above discussion of operation 110 is applicable to operation 410. In some embodiments, the polysilicon layer is deposited on a dielectric layer, such as an interfacial layer, a gate dielectric layer, an isolation structure or another suitable dielectric layer.

In optional operation 420, the polysilicon layer is doped. Operation 420 is similar to operation 120; and the above discussion of operation 120 is applicable to operation 420. In some embodiments, operation 420 is omitted and a single doping process is performed in operation 460.

In operation 430, a barrier layer is formed over the polysilicon layer. In comparison with operation 140, operation 430 is performed on a polysilicon layer not on a patterned polysilicon structure. As a result, the process for forming the barrier layer acts on the top surface of the polysilicon layer and on the sidewalls of the polysilicon layer at the edge of the substrate. The formation process acting primarily on the top surface of the polysilicon layer means that the thickness of the barrier layer formed by operation 430 is substantially constant. Variations in the thickness result from process gradients and imperfections in crystal structure of the polysilicon layer, in some instances; however, the thickness of the barrier layer is substantially constant. The formation processes for forming the barrier layer in operation 430 are similar to the processes for forming the barrier layer in operation 140; and the discussion is not repeated here for the sake of brevity.

In operation 440, the height of the polysilicon layer and barrier layer is compared to a threshold value. The determination of the threshold value is based on the technology node of the semiconductor device. The discussion of operation 150 above is applicable to operation 440 and is not repeated here for the sake of brevity. If the height fails to satisfy the threshold value, then method 400 returns to operation 410. Similar to method 100, in some embodiments of method 400, formation of the barrier layer over a top most polysilicon layer is omitted. In some embodiments, method 400 further includes an operation for removing a top-most barrier layer over a top-most polysilicon layer.

If the height satisfies the threshold value, method 400 proceeds to operation 450. In operation 450, the polysilicon layers and barrier layers are patterned to define a location of gate structures or resistor structures. Gate structures are located over conductive regions of the substrate. Resistor structures are located over non-conductive regions, such as isolation structures, of the substrate.

In some embodiments, the patterning process is performed using a photoresist as a mask for an etching process. A discussion of the use of a photoresist to create a mask for etching is provided above in with respect to operation 130. The description is not repeated for the sake of brevity. An etching process for operation 450 is either a wet etching process or a dry etching process. In some embodiments, different etchants are used to remove material from a barrier layer from that used to remove material from a polysilicon layer due to differences in etch selectivity. For example, in some embodiments, a chlorine-containing etchant is used to remove material from polysilicon layers; and a fluorine-containing etchant is used to remove material from barrier layers. In some embodiments, a material removal process other than etching, e.g., laser drilling, is used for operation 450.

In operation 460, additional processes are used to complete formation of gate structures or resistor structures. Operation 460 is similar to operation 160; and the discussion above for operation 160 is applicable for operation 460.

In some embodiments, method 400 includes additional operations. For example, in some embodiments, method 400 includes an operation for removing a top most barrier layer over a top most polysilicon layer. In some embodiments, an order of operations is adjusted. For example, in some embodiments, operation 430 is performed prior to operation 420. In some embodiments, at least one operation of method 400 is omitted. For example, in some embodiments, operation 420 is omitted and a single doping process is performed during operation 160.

FIGS. 5A-5D are cross-sectional views of a semiconductor device at various stages of manufacturing according to some embodiments. Same reference numbers correspond to same elements in each of the Figures. FIG. 5A is a cross-sectional view of a semiconductor device 500 following deposition of polysilicon layer 520 according to some embodiments. Polysilicon layer 520 is on substrate 210. In some embodiments, a dielectric layer, such as an interfacial layer, a gate dielectric, an isolation structure or another suitable dielectric layer, is between at least a portion of polysilicon layer 520 and substrate 510. A thickness of polysilicon layer 520 ranges from about 10 nm to about 400 nm. In some embodiments, polysilicon layer 520 is doped.

FIG. 5B is a cross-sectional view of semiconductor device 200' following formation of barrier layer 530 according to some embodiments. In comparison with semiconductor device 500, semiconductor device 500' includes barrier layer 530 over polysilicon layer 520. In some embodiments, barrier layer 530 includes silicon oxide, silicon nitride, silicon oxynitride, silicon carbide or another suitable barrier material. In some embodiments, barrier layer 230a includes a same material as barrier layer 230b. A thickness of barrier layer 230 is substantially constant. In some embodiments, a thickness of the barrier layer ranges from about 0.3 nm to about 5 nm. As a thickness of the barrier layer increases, a resistance in the polysilicon structure increases. If a thickness of the barrier layer is too small, the barrier layer will not be able to inhibit increases in grain size in the polysilicon material.

FIG. 5C is a cross-sectional view of semiconductor device 500" after deposition of a second polysilicon layer 540 according to some embodiments. In comparison with semiconductor device 500', semiconductor device 500" includes polysilicon layer 540 over barrier layer 530. A thickness of polysilicon layer 540 ranges from about 10 nm to about 400 nm. In some embodiments, polysilicon layer 540 has a same thickness as polysilicon layer 520. In some embodiments, polysilicon layer 540 has a different thickness from polysilicon layer 520. In some embodiments, polysilicon layer 540 is deposited using a same process as that used for polysilicon layer 520. In some embodiments, polysilicon layer 540 is deposited using a different process from that used for polysilicon layer 520. In some embodiments, polysilicon layer 540 is doped.

FIG. 5D is a cross-sectional view of semiconductor device 200\* following patterning of the polysilicon layers 520 and 540 and barrier layer 530 according to some embodiments. In comparison with semiconductor device 500", semiconductor device 500\* includes gate structures 550a and 550b. Polysilicon structure 520a; barrier layer 530a and polysilicon structure 540a are part of a gate structure 250a. Polysilicon structure 520b; barrier layer 530b and polysilicon structure 540b are part of a gate structure 250b. Gate structures 550a and 520b are formed by removing portions of polysilicon layer 520; barrier layer 530 and polysilicon layer 540, such as by using a lithography and etching process.

In some embodiments, a portion of substrate 510 below gate structure 550a has a different dopant type from a portion of substrate 510 below gate structure 550b. In some embodiments, an isolation feature, such as a shallow trench isolation (STI), is in substrate 510 below gate structure 550a or gate structure 550b. Semiconductor device 500\* includes two gate structures 550a and 550b. In some embodiments, semiconductor device 500\* includes more than two gate structures.

Figure 6:
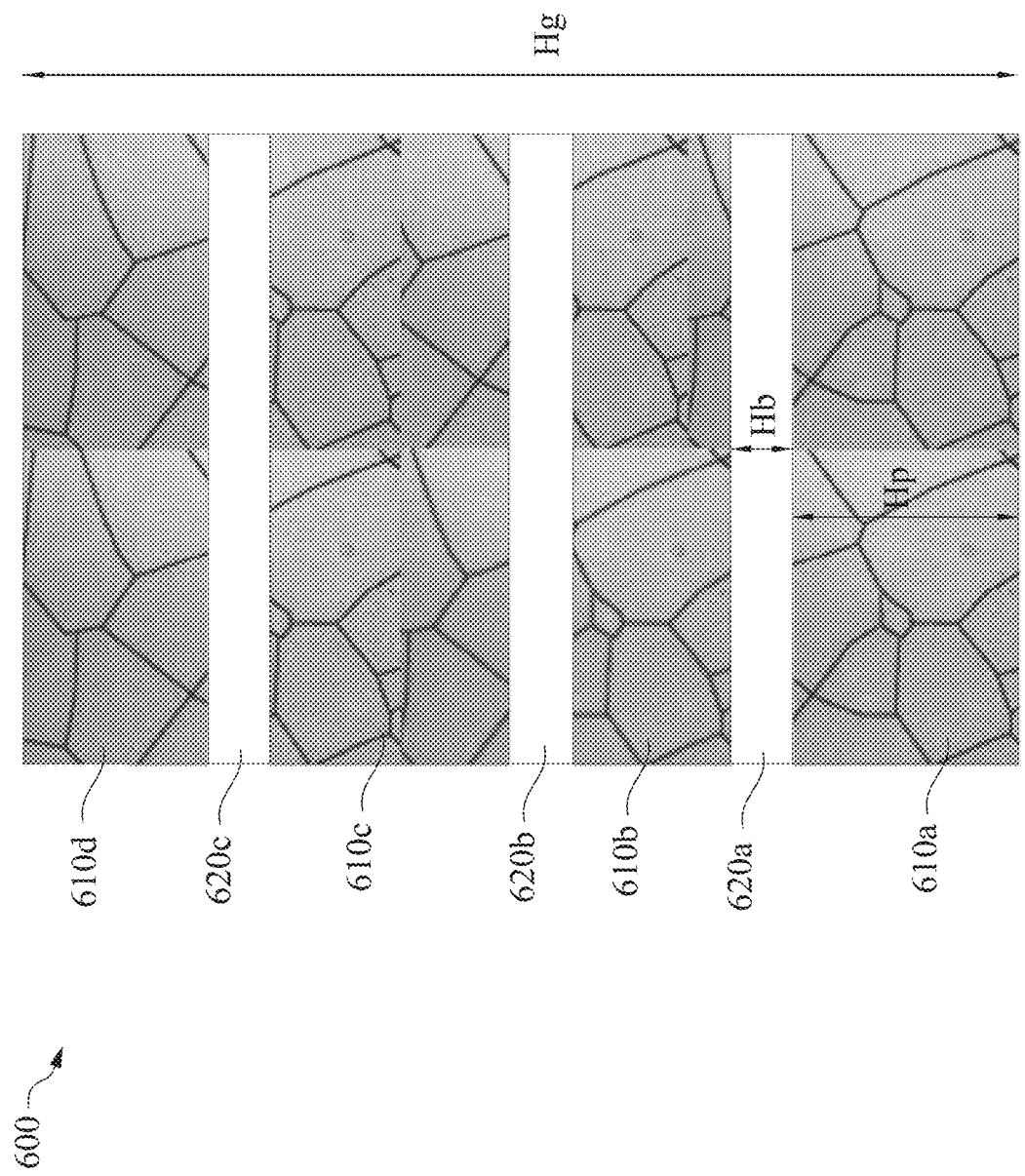
FIG. 6 is a cross-sectional view of a gate structure according to some embodiments.

FIG. 6 is a cross-sectional view of a gate structure 600 according to some embodiments. Gate structure 600 includes polysilicon structures 610a, 610b, 610c and 610d, collectively referred to as polysilicon structures 610. Gate structure 600 further includes barrier layers 620a, 620b and 620c, collectively referred to as barrier layers 620. While gate structure 600 includes three barrier layers, in some embodiments, a number of barrier layers in gate structure 600 ranges from 1 to about 10. Barrier layers 620 independently have a dielectric constant ranging from about 2 to about 13. Barrier layer 620a is between polysilicon structure 610a and polysilicon structure 610b. Barrier layer 620b is between polysilicon structure 610b and polysilicon structure 610c. Barrier layer 620c is between polysilicon structure 610c and polysilicon structures 610d. A grain size in polysilicon structure 610a is greater than a grain size in polysilicon structure 610b. A grain size in polysilicon structure 610b is greater than a grain size in polysilicon structure 610c. A grain size of in polysilicon structure 610c is greater than a grain size in polysilicon structure 610d. The larger grain sizes are the result of the lower polysilicon structures 610 being subjected to a greater number of thermal processes.

A thickness Hb of the barrier layers 620 is substantially constant across gate structure 600. In some embodiments, thickness Hb of the barrier layers 320 independently ranges from about 0.3 nm to about 5 nm. As a thickness of the barrier layers 620 increase, a resistance in the gate structure 600 increases. If a thickness of the barrier layers 620 is too small, the barrier layers will not be able to inhibit increases in grain size in the polysilicon structures 610.

A thickness Hp of polysilicon structures 610 independently ranges from about 10 nm to about 400 nm. In some embodiments, at least one of polysilicon structures 610 is doped. The thickness Hp of polysilicon structures 610 is determined based on a technology node of the semiconductor device containing gate structure 600. A gate height Hg of gate structure 600 ranges from about 15 nm to about 410 nm. The gate height Hg of gate structure 600 is determined based on a technology node of the semiconductor device containing gate structure 600.

Figure 7:
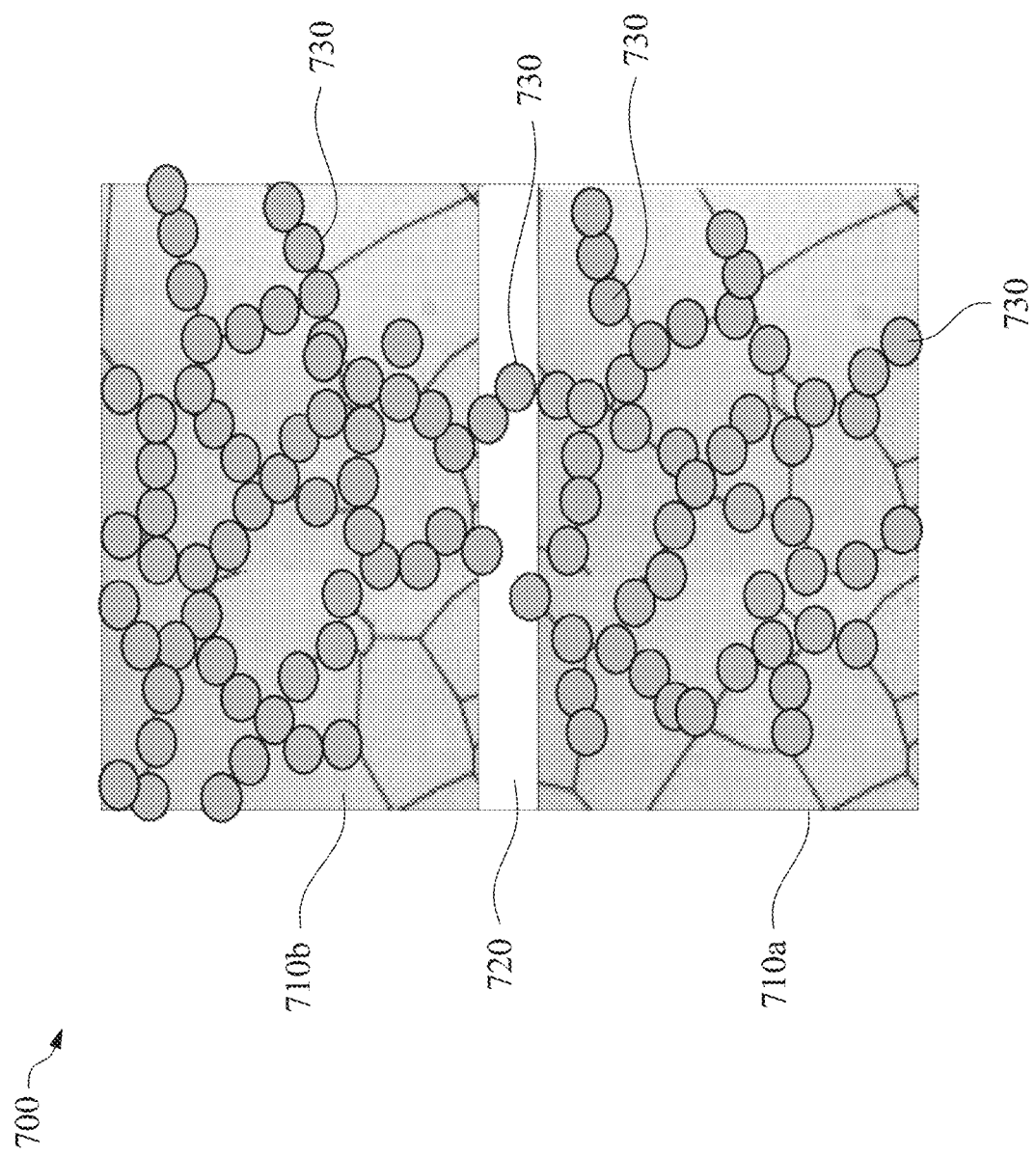
FIG. 7 is a cross-sectional view of a gate structure including dopants according to some embodiments.

FIG. 7 is a cross-sectional view of a gate structure 700 according to some embodiments. Gate structure 700 includes polysilicon structures 710a and 710b, collectively referred to as polysilicon structures 710. Gate structure 700 further includes barrier layer 720. Barrier layer 720 is between polysilicon structure 710a and polysilicon structure 710b. A grain size in polysilicon structure 710a is greater than a grain size in polysilicon structure 710b. The larger grain sizes are the result of the lower polysilicon structures 710 being subjected to a greater number of thermal processes. Gate structure 700 also includes dopants 730.

Dopants 730 are located along grain boundaries in polysilicon structures 710. Dopants 730 are also present in barrier layer 720. In some embodiments, dopants 730 are driven into barrier layer 720 during an annealing process to active the dopants. In some embodiments, dopants 730 are implanted into barrier layer 720.

In comparison with other approaches, maintaining smaller grain sizes in polysilicon structures 710 helps to create numerous conductive paths through gate structure 700. As a number of conductive paths in gate structure 700 increase, the resistance of gate structure 700 decreases. The smaller grain boundaries also result in a more even distribution of dopants 730 in gate structure 700 as compared to other approaches. The even distribution helps to increase predictability of performance of gate structure 700 in relation with other gate structures in a same semiconductor device. The increased predictability of performance increases precision in data retrieval in memory devices which include barrier layer 720; and reduce overdesign of batteries for devices which include barrier layer 720.

While barrier layer 720 is depicted as having a substantially constant thickness, similar to barrier layers 620 (FIG. 6); the above discussion about dopants 730 is also applicable to barrier layers having varying thicknesses, such as barrier layers 320 (FIG. 3).

An aspect of this description relates to a semiconductor device. The semiconductor device includes a substrate. The semiconductor device further includes a first polysilicon structure over the substrate, wherein the first polysilicon structure has a first grain size. The semiconductor device further includes a first barrier layer over the first polysilicon structure, wherein the first barrier layer has a non-uniform thickness. The semiconductor device further includes a second polysilicon structure over the first barrier layer, wherein the second polysilicon structure has a second grain size smaller than the first grain size. In some embodiments, a first thickness of the first barrier layer in a central region is less than a second thickness of the first barrier layer in a peripheral region. In some embodiments, the semiconductor device further includes a second barrier layer over the second polysilicon structure. In some embodiments, the semiconductor device further includes a third polysilicon structure over the second barrier layer. In some embodiments, the third polysilicon structure has a third grain size different from the second grain size. In some embodiments, a thickness of the second barrier layer is non-uniform. In some embodiments, the semiconductor device further includes dopants in each of the first polysilicon structure and the second polysilicon structure.

An aspect of this description relates to a semiconductor device. The semiconductor device includes a substrate. The semiconductor device further includes a first polysilicon structure over the substrate. The semiconductor device further includes a first barrier layer over the first polysilicon structure. The semiconductor device further includes a second polysilicon structure over the first barrier layer. The semiconductor device further includes dopants in each of the first polysilicon structure, the first barrier layer and the second polysilicon structure, wherein a uniformity of a distribution of dopants in the first polysilicon structure is different from a uniformity of a distribution of dopants in the second polysilicon structure. In some embodiments, the dopants are in the first barrier layer. In some embodiments, the first barrier layer has a substantially constant thickness. In some embodiments, the first barrier layer has a varying thickness. In some embodiments, the dopants are distributed along grain boundaries in the first polysilicon structure and the second polysilicon structure. In some embodiments, the first polysilicon structure has a larger grain size than the second polysilicon structure.

An aspect of this description relates to a method of making a semiconductor device. The method includes depositing a first polysilicon layer over a substrate. The method further includes forming a barrier layer over the first polysilicon layer. The method further includes depositing a second polysilicon layer over the barrier layer. The method further includes increasing a grain size of the first polysilicon layer simultaneously with depositing the second polysilicon layer. In some embodiments, the method further includes determining whether a height of the semiconductor device satisfies a threshold value following depositing the second polysilicon layer. In some embodiments, the method further includes forming a second barrier layer over the second polysilicon layer in response to a determination that the height of the semiconductor device fails to satisfy the threshold value. In some embodiments, the method further includes depositing a third polysilicon layer over the second barrier layer. In some embodiments, the method further includes increasing a grain size of the second polysilicon layer simultaneously with depositing the third polysilicon layer. In some embodiments, the method further includes increasing the grain size of the first polysilicon layer simultaneously with depositing the third polysilicon layer. In some embodiments, forming the barrier layer includes forming the barrier layer having a non-uniform thickness.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
    a substrate;
    a first polysilicon structure over the substrate, wherein the first polysilicon structure has a first grain size;
    a first barrier layer over the first polysilicon structure, wherein the first barrier layer has a non-uniform thickness; and
    a second polysilicon structure over the first barrier layer, wherein the second polysilicon structure has a second grain size smaller than the first grain size.

2. The semiconductor device of claim 1, wherein a first thickness of the first barrier layer in a central region is less than a second thickness of the first barrier layer in a peripheral region.

3. The semiconductor device of claim 1, further comprising a second barrier layer over the second polysilicon structure.

4. The semiconductor device of claim 3, further comprising a third polysilicon structure over the second barrier layer.

5. The semiconductor device of claim 4, wherein the third polysilicon structure has a third grain size different from the second grain size.

6. The semiconductor device of claim 3, wherein a thickness of the second barrier layer is non-uniform.

7. The semiconductor device of claim 1, further comprising dopants in each of the first polysilicon structure and the second polysilicon structure.

8. A semiconductor device comprising:
    a substrate;
    a first polysilicon structure over the substrate;
    a first barrier layer over the first polysilicon structure;
    a second polysilicon structure over the first barrier layer; and
    dopants in each of the first polysilicon structure, the first barrier layer and the second polysilicon structure, wherein a uniformity of a distribution of dopants in the first polysilicon structure is different from a uniformity of a distribution of dopants in the second polysilicon structure.

9. The semiconductor device of claim 8, wherein the dopants extend through an entire thickness of the first barrier layer.

10. The semiconductor device of claim 8, wherein the first barrier layer has a substantially constant thickness.

11. The semiconductor device of claim 8, wherein the first barrier layer has a varying thickness.

12. The semiconductor device of claim 8, wherein the dopants are distributed along grain boundaries in the first polysilicon structure and the second polysilicon structure.

13. The semiconductor device of claim 8, wherein the first polysilicon structure has a larger grain size than the second polysilicon structure.

14. A method of making a semiconductor device, the method comprising:
    depositing a first polysilicon layer over a substrate;
    forming a barrier layer over the first polysilicon layer;
    depositing a second polysilicon layer over the barrier layer; and
    increasing a grain size of the first polysilicon layer simultaneously with depositing the second poly silicon layer.

15. The method of claim 14, further comprising determining whether a height of the semiconductor device satisfies a threshold value following depositing the second polysilicon layer.

16. The method of claim 15, further comprising forming a second barrier layer over the second polysilicon layer in response to a determination that the height of the semiconductor device fails to satisfy the threshold value.

17. The method of claim 16, further comprising depositing a third polysilicon layer over the second barrier layer.

18. The method of claim 17, further comprising increasing a grain size of the second polysilicon layer simultaneously with depositing the third polysilicon layer.

19. The method of claim 17, further comprising increasing the grain size of the first polysilicon layer simultaneously with depositing the third polysilicon layer.

20. The method of claim 14, wherein forming the barrier layer comprises forming the barrier layer having a non-uniform thickness.

* * * * *